United States Patent [19]
Gazzana Priaroggia

[11] Patent Number: 5,734,127
[45] Date of Patent: Mar. 31, 1998

[54] USE OF BARIUM COPPER OXIDE COMPOUNDS AS HIGH CRITICAL TEMPERATURE SUPERCONDUCTORS

[76] Inventor: Paolo Gazzana Priaroggia, Piazza S. Ambrogio, 8 - Milan, Italy

[21] Appl. No.: 54,643

[22] Filed: Feb. 11, 1993

Related U.S. Application Data

[62] Division of Ser. No. 742,040, Aug. 8, 1991, abandoned.
[51] Int. Cl.$^6$ .................................................. H01B 12/00
[52] U.S. Cl. .................... 174/125.1; 505/125; 505/775
[58] Field of Search .................... 174/125.1; 505/100, 505/125, 775, 776, 778, 801

[56] References Cited

U.S. PATENT DOCUMENTS 4,892,862  1/1990  Ogushi et al. ............................ 505/473

FOREIGN PATENT DOCUMENTS 0310182  4/1989  European Pat. Off. ................. 29/599

OTHER PUBLICATIONS

Rao et al. "Superconductivity Studies on the High $T_c$ Phase in the Y–Ba–Cu–O System", Jap. J. Appl. Phys., vol. 26 (1987), Supplement 26-3, pp. 1077–1078.

Leeuw, "Structure and Conductivity of Copper Oxide Based Compounds*, 1989, European Materials Research Society Symposia Proceedings." pp. 95–107.

Kovacs et al. "Structure and Superconductivity of Variously Prepared T1–Ca–Ba–Cu–O Compounds", 1989 European Materials Research Society Symposta Proceedings 6A, pp. 229–240.

*Primary Examiner*—Hyung S. Sough
*Attorney, Agent, or Firm*—Young & Thompson

[57] ABSTRACT

A new use as high critical temperature superconductors, of a known family of partially oxidized bi-metal compounds in which the two metals are copper and barium. These compounds become superconductive at least at a temperature higher than 5° K. but less than or equal to 77° K., when oxygen vacancies are located symmetrically with respect to the axes of their lattice structure.

3 Claims, 1 Drawing Sheet

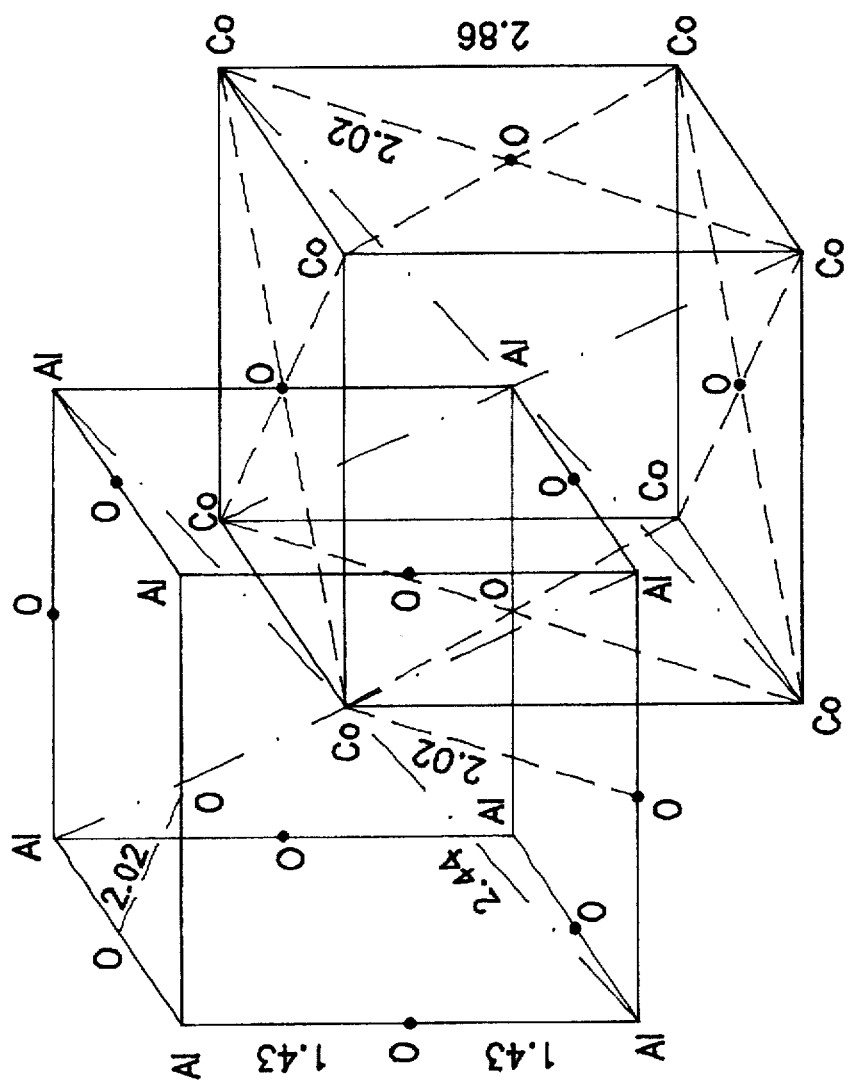

USE OF BARIUM COPPER OXIDE COMPOUNDS AS HIGH CRITICAL TEMPERATURE SUPERCONDUCTORS

This application is a division of application Ser. No. 07/742,040, filed Aug. 8, 1991, now abandoned.

BACKGROUND OF THE INVENTION

During the last few years several high critical temperature superconducting materials have been discovered. High critical temperature means a critical temperature higher than the liquefaction temperature of helium (−268° C.,=5K) and generally lower than the liquefaction temperature of nitrogen (−147° C.=126K), and critical temperature means the transition temperature from the normal state to the superconducting state.

All these materials consist of suitably combined metallic oxides. Generally concerned are ternary compounds (viz. oxidized ternary metallic compounds) and quaternary or even higher order metallic compounds.

The most widely known such materials have the chemical formula:

$Ba_2YCu_3O_7$ (barium-yttrium-copper-oxygen)
$Bi_2Sr_2CuO_6$ (bismuth-strontium-copper-oxygen)
$Tl_2Ba_2CuO_6$ (tallium-barium-copper-oxygen).

Several other compounds have been discovered in which, e.g., instead of strontium or yttrium, other elements of the rare-earth group are included or in which, instead of three, four or more elements appear, as already stated.

The above materials have in common the disadvantage of being highly anisotropic in their superconductive properties with respect to the principal directions of their spatial structure.

In other words, their crystals show preferential directions along which the supercurrents can flow, whereas they show other directions along which the supercurrents do not flow at all or in an extremely low intensity.

Consequently, since the above materials are practically made of a plurality of randomly oriented microcrystals, their superconducting properties are on the whole limited to a large extent.

SUMMARY OF THE INVENTION

The object of the present invention is the discovery of a new class of high critical temperature superconducting materials consisting of intermetallic compounds, possibly oxidized, having the characteristic of showing isotropic superconductivity with respect to the principal axes of their crystalline structure.

These compounds differ from the previously mentioned materials inasmuch as they are binary (viz. of two metals) intermetallic compounds. Moreover, one of the two metal components is a so-called transition metal, whereas the other metal is a normal metal, e.g. of the class of the so-called light metals.

As it is known, a transition metal is a metal characterized by showing incomplete d electronic orbitals.

Transition metals, as known, are: scandium, titanium, vanadium, chromium, manganese, iron, cobalt, nickel, yttrium, zirconium, niobium, molybdenum, technetium, ruthenium, rhodium and others yet, amongst which are copper and zinc ions in their higher ionized state.

As it is known, light metals are: aluminium, magnesium.

The general chemical formula of the new class of high critical temperature superconducting materials, object of the present invention, is:

$$(T)_x(N)_yO_z$$

where
(T)=transition metal
(N)=normal metal( e.g. a light one)
O=oxygen
$x=y\pm10\%$, that is $x=y+0.1\ y$ $$\frac{z}{x} < 3$$

in particular $x=1\pm0.1\ y=1\pm0.1$, in other words, x has a value ranging from 0.9 y to 1.1 y, to 1.1 y z can have two particular values:
a) z=0, i.e. a non-oxidized binary intermetallic compound of the formula: $(T)_x(N)_y$.
x still being=$y\pm10\%$ y
b) z can be comprised between the value of about $$v\frac{x}{6}$$

and the value of $$v\frac{x}{2},$$

where v=valence of (N), i.e.

$$v\frac{x}{6} \leq z \leq v\frac{x}{2}.$$

in particular:

$$\frac{v}{6} \leq z \leq \frac{v}{2},$$

if x=1.

This leads to a class of oxidized binary intermetallic compounds.

On the contrary the class of lightly oxidized intermetallic compounds for which $$0 < z < \frac{v}{6}$$

does not show high critical temperature superconducting properties.

From the above, the following compounds can be considered as specific cases of high critical temperature superconducting materials, object of the present invention:

AlCo, AlNi, AlFe wherein Al=aluminium, Co=cobalt, Ni=nickel, Fe=iron, all non-oxidized binary intermetallic compounds, as well as the following oxidized binary intermetallic compounds:

$AlCoO_{1/2}$, $AlNiO_{1/2}$, $AlFeO_{1/2}$, $AlCoO_{3/2}$, $AlNiO_{3/2}$, $AlFeO_{3/2}$, wherein v=valence of aluminium=3.

In the general formula also the following oxidized compounds are included:

$AlCuO_2$, $AlCuO_{5/2}$, wherein Cu=copper.

In these compounds aluminium (Al) can be replaced by any other normal metal, such as barium (Ba), calcium (Ca), bismuth (Bi), provided that copper (Cu) is in its higher ionization state.

Another case of oxidized binary intermetallic compounds, falling within the general formula of the present invention, is represented by the following compounds:

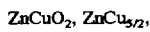

wherein Zn=zinc, and by their intermediate oxidation compounds, in which only one of the two metals acts as a transition metal inasmuch as it is more ionized, while the other one acts as a normal metal. In these compounds zinc (Zn) can be replaced by any transition metal such as yttrium (Y), lantanium (La), palladium (Pd), provided that copper (Cu) is in its lower ionization state.

It may be useful to try and offer an explanation of the behaviour of these new high temperature superconducting materials, of the present invention.

First of all, by means of X-ray diffraction, the crystalline structure of the new materials has been determined in order to detect possible analogies with the crystalline structures of the oxidized intermetallic ternary and higher order compounds mentioned in the introductory clauses.

In order to simplify the exposition, the case of compound $AlCoO_z$ is considered hereinafter exemplary.

The structure of this compound, resulting from the oxidation of AlCo is represented in the attached figure for the "limit case" wherein z=3.

As can be seen, the structure is cubic, body centered, having a lattice parameter=2.86 Å (1 Å=$10^{-8}$cm), in which the Al atoms are located at the cube vertexes and the Co atoms are located at the cube centres (and vice versa), while the oxygen atoms are located at the mid point of the cube edges of the aluminium lattice (or at the face centre of the cobalt cubic lattice), without any large deformation of the lattice with respect to the case wherein z=0, i.e. of the nonoxidized AlCo compound.

It can thus be seen that the crystal lattice of this material shows a much more evident contraction (i.e. smaller interatomic distances) than the crystal lattice of prior art low critical temperature superconductors (by low critical temperature meaning a transition temperature lower than the liquefaction temperature of helium) in analogy with the crystal lattices of the above mentioned oxidized ternary or higher order compounds. For instance, the known superconductor $GeNb_3$ (germanium-niobium shows a minimum interatomic distance of 4.39 Å whereas both the compound $Ba_2YCu_3O_7$ (cited in the introductory part) and the "limit compound" $AlCoO_3$, illustrated in the attached Figure, show an interatomic distance smaller than 3 Å and even 2 Å.

It can be mentioned at this point that the high contraction of the crystal lattice of $AlCoO_3$ is due to the presence of a transition metal (viz.Co). This is a well known behaviour of the binary compounds in which one element is a transition metal and the other element is a normal metal.

This observation leads to the hypothesis that the mechanism which governs the superconductivity in high critical temperature superconductors may be somewhat different from that which applies to low critical temperature materials. Such an hypothesis has already been suggested in the technical literature.

It can consequently be assumed that the very narrow lattice structure inevitably causes more or less extensive overlapping of electronic orbitals of several contiguous atoms, thus facilitating the hopping of electrons from the orbitals of one atom to those of the contiguous one, without the need for overcoming energetical barriers, which is a favourable condition for the flow of electric current without any energy loss (supercurrents).

The only disturbance to the free flow of electrons through the lattice would be due to the lattice phonons, the latter being lattice vibrations, the intensity and frequency of which is a function of the temperature. Therefore the critical temperature is determined as the temperature below which the lattice phonons not only do not cause appreciable disturbance to the free hopping of the electrons but on the contrary they stimulate the hooping itself through their physical characteristics (frequency, direction, amplitude).

Here too the further importance of the presence of a transition metal is evident because since such metal has incomplete d orbitals, this facilitates the hopping of electrons from the near atoms, under the synchronizing stimulus of phonons, allowing for higher flexibility in the hopping machanism.

If $\Sigma$ indicates the sum of ion radii of contiguous atoms (when dealing with oxidized compounds) or the sum of metal radii (when dealing with non-oxidized compounds) and $\Delta$ the interatomic distance between contiguous atoms, in all high critical temperature superconductors is found a nominal orbital overlapping, $\Sigma-\Delta$, of from 0.25 Å to 0.6 Å, along the very lattice axes of maximum superconductivity, whereas negative or zero values of $\Sigma-\Delta$ are found along the axes of minimum or nil superconductivity.

The hypothesis based on orbital overlapping is strengthened by the observation that the application of very high hydrostatic pressure to high critical temperature superconductors causes an increase of the critical temperature since it tends to decrease the interatomic distances and consequently to increase the orbital overlapping.

BRIEF DESCRIPTION OF THE DRAWING

The sole FIGURE depicts the lattice structure of compound $AlCoO_z$.

DETAILED DESCRIPTION OF THE INVENTION

Let the lattice structure of compound $AlCoO_z$ shown in the attached FIGURE be examined in detail, taking into consideration the values of the metal or ion radii of the relevant elements:

| | | |
|---|---|---|
| aluminium | metal radius = | 1.43 Å |
| | ion radius = | 0.57 Å |
| cobalt | metal radius = | 1.26 Å |
| | ion radius = | 0.82 Å |
| oxygen | ion radius = | 1.32 Å |

It can be seen that if oxidation is totally absent, i.e. when, in the attached FIGURE oxygen atoms are completely absent (pure AlCo), the only possible orbital overlapping exists between the Co atom in the cube centre and the Al atom at the cube vertexes (or vice versa) and has the value $(\Sigma-\Delta)_{Al-Co}=(1.43+1.26)-2.44=0.25$ Å the two metals being non-ionized.

This results in a perfectly isotropic distribution of orbital overlapping with respect to the crystallographic axes, and therefore of the superconductivity according to the above formulated hypothesis and according to the claims of the present invention.

In a similar way, it can be observed that in the "limit compound" of maximum oxidation $AlCoO_3$, no orbital overlapping occurs anymore between Al and Co, but on the other hand a substantial amount of orbital overlapping occurs between Al and O:

$$(\Sigma-\Delta)_{Al-O}=(0.57+1.32)-1.43=0.46 \text{ Å}$$

on the assumption that Al is ionic, it being more oxidizable, and between Co and O:

$$(\Sigma-\Delta)_{Co-O}=(1.26+1.32)-2.02=0.56 \text{ Å}$$

on the assumption that Co is metallic, it being non-oxidized.

The distribution of the above orbital overlappings is still perfectly isotropic with respect to the crystallographic axes and confirms, in this case too, the spatial isotropy of superconductivity according to the assumptions. Moreover, the number of orbital overlappings is here much larger than in the previous case and the relevant values are much higher, again confirming what is claimed herein.

There remains to explain the absence of superconductivity in the case of light oxidation.

Following a purely qualitative reasoning, it can be assumed that, if the oxidation is sufficient to ionize a certain number of aluminium atoms, the continuity of cross-linked orbital overlappings between Al and Co is interrupted in several points, there being in these points:

$$(\Sigma-\Delta)_{Al-Co}=(0.57+1.26)-2.44=-0.6$$

i.e. no overlapping.

On the other hand, the fact that a number of orbital overlappings arise between Al and O, and between Co and O, does not allow, in this case, to compensate the lack of orbital overlapping between Co and Al, because the characteristic of continuity through the lattice, necessary to guarantee superconductivity, does not exist.

On the basis of the above theoretical considerations on compound $AlCoO_z$, it has been attempted to explain the findings which are the object of the present invention.

These considerations can be extended to the whole family of compounds having the general formula $(T)_x(N)_yO_z$, wherein $$x = y \pm 10\% \; y; \; \frac{z}{x} < 3.$$

The main advantage of the new compounds with respect to the prior art oxidized ternary or quaternary compounds is essentially the spatial isotropy of superconductivity, which is a very important property for all practical applications.

It must be stressed that for the practical applications the oxidized compounds are of greater interest than the nonoxidized ones because it is very difficult in practice to obtain intermetallic compounds absolutely free even of light oxidation.

Finally, a comment is required about the process of attaining a spatial isotropy of the superconductivity. This is strictly dependent on the spatial symmetry of the crystal lattice about its axes. Such symmetry is spontaneously obtained in the pure bimetal compounds (T), (N), having a bodycentered cubic structure as claimed in the instant patent, and also in the fully oxidized bimetal compounds having a perovskitic structure ($z/x=3$), shows in the attached FIGURE (which compounds however are generally not susceptible to superconductivity). But when bimetal compounds with partial oxidation ($z/x<3$) are considered, which are the main object of the present invention, it is necessary to mention the preparation method.

It is known that for the superconducting oxidized compounds, known from the prior art, in which three or more metals are present, the most widely used preparation method is that of admixing oxides of the metal components, in fine powder form, in appropriately selected proportions, and then of sintering them under high pressure, at temperatures between 700° C. and 1000° C., with possible subsequent thermal treatment to cause a guided oxygen diffusion.

In the case of the oxidized superconducting compounds, subject matter of the present invention, the spatial symmetry of the lattice requires that the oxygen vacancies be located symmetrically with respect to the crystallographic axes. This can be generally be achieved following a process similar to that described above for the already known superconductors but starting from a mixture of components, again in fine powder form, in which are present not only suitable oxides of the two metals (T), (N) but also the metals (T), (N), themselves, in pure form, in appropriate proportions, depending on the oxygen vacancies which are to be obtained and on their location in the lattice.

Such oxygen vacancies and relevant locations are determined depending on the type of metal components present inasmuch as together they concur to produce the phonon characteristics (frequency, direction, amplitude, as much as depending on the temperature) which stimulate superconductivity.

Finally, the methods for calculating the phonon characteristics can be found in the existing scientific literature.

I claim:

1. A method of conducting electricity, comprising cooling a quantity of a compound of the formula $Ba_xCu_yO_z$, wherein x has a value ranging from $0.9y$ to $1.1y$, $z/x$ being less than 3, to a temperature higher than 5° K. but less than or equal to about 77° K., at which said compound becomes superconductive, and passing an electric current through said compound, said compound having a lattice having oxygen vacancies located symmetrically with respect to its crystallographic axes.

2. The method of claim 1, wherein said compound is $BaCuO_2$.

3. The method of claim 1, wherein said compound is $Ba_2Cu_2O_5$.

* * * * *